United States Patent [19]

Smesny et al.

[11] Patent Number: 5,354,413
[45] Date of Patent: Oct. 11, 1994

[54] ELECTRODE POSITION CONTROLLER FOR A SEMICONDUCTOR ETCHING DEVICE

[75] Inventors: Greg A. Smesny; Roger A. Sikes, both of Austin; Michael R. Conboy, Buda, all of Tex.

[73] Assignee: Advanced Micro Devices, Inc., Sunnyvale, Calif.

[21] Appl. No.: 33,025

[22] Filed: Mar. 18, 1993

[51] Int. Cl.⁵ .................... G01C 5/00; H01L 21/00
[52] U.S. Cl. .................... 156/627; 156/643; 156/345; 204/298.32
[58] Field of Search ............ 156/626, 627, 643, 345; 204/298.03, 298.32; 250/341; 118/712

[56] References Cited

U.S. PATENT DOCUMENTS

| | | | |
|---|---|---|---|
| 3,941,985 | 3/1976 | Kawase et al. | 235/151.1 |
| 4,070,578 | 1/1978 | Timothy et al. | 250/336 |
| 4,114,035 | 9/1978 | Herzog | 250/211 K |
| 4,724,322 | 2/1988 | Knowles et al. | 250/341 |
| 5,132,545 | 7/1992 | Shono et al. | 250/492.2 |
| 5,225,830 | 7/1993 | Andermo et al. | 341/13 |

*Primary Examiner*—Thi Dang
*Attorney, Agent, or Firm*—Kevin L. Daffer

[57] ABSTRACT

A high precision electrode position controller is provided for use in a semiconductor etching device. The electrode position controller, system, and method of use can accurately and repeatedly position a dry etch electrode within the etch chamber without having to open the chamber and manually move the electrode. Moreover, the actual gap between electrodes can be calibrated each time the etching device is turned on. Frequent calibration of actual electrode position ensures the electrodes are positioned parallel to each other and at an optimal distance therebetween. Accurate positioning of the electrodes provides a more precise etch rate and a more uniform etch across the wafer surface. By repositioning the electrodes and maintaining parallelism, varying types of material can be accurately etched.

20 Claims, 7 Drawing Sheets

ELECTRODE POSITION CONTROLLER FOR A SEMICONDUCTOR ETCHING DEVICE

BACKGROUND OF THE INVENTION

Incorporated herein is a computer program listing microfiche appendix of source code used to control and calibrate electrode position within a semiconductor etching device according to the present invention. Copyright, 1993, Advanced Micro Device, Inc. A portion of the disclosure to this patent document contains material which is subject to copyright protection. The copyright owner has no objection to the facsimile reproduction by anyone of the "microfiche appendix", as it appears in the Patent and Trademark Office file or records, but otherwise reserves all copyright rights whatsoever.

1. Field of the Invention

This invention relates to the manufacture of integrated circuits and more particularly to an integrated circuit etching apparatus including an improved device, system and method for calibrating and controlling the position of electrodes within the etching device.

2. Background of the Relevant Art

It is well known that during integrated circuit manufacturing, whole wafers are coated with a layer or layers of various materials such as silicon dioxide, silicon nitride, or metallization. The unwanted material can be selectively removed by masked photolithography and etchants to leave, for example, holes in a thermal oxide where diffusions are to be made, or long strips of aluminum for electrical interconnect between individual circuit elements. Accordingly, fine-line geometries can be produced by removing or etching select regions of material between the structures.

There are several etching techniques commonly used, including: wet chemical, electrochemical, pure plasma, reactive ion, ion beam milling, sputtering, and high temperature vapor. Wet etching generally involves immersing wafers containing select areas of photoresist in an aqueous etching solution. Wet etching, while the oldest and least expensive technique, is gradually being replaced by dry etching techniques such as plasma etching and combination plasma/reactive ion etching (RIE). Plasma and RIE techniques, often called dry etching, are relatively new and are performed in low pressure gaseous plasma. Dry etching generally involves fewer safety hazards and less spent chemical disposal problems, and also produces finer line geometric structures.

Dry etching generally requires an etching chamber capable of receiving gaseous etchant. The etchant can be pressurized within the chamber and, after etching is completed, the gaseous material and volatile by-products can be pumped away or evacuated from the chamber. Operating pressure depends upon the material being etched, the gas etchant chosen, and may range from a few torr to fractions of a millitorr. The etching chamber also includes a pair of electrodes at opposing sides or ends of the chamber. One electrode is generally charged by an rf power supply while the other electrode is grounded. Typically, the powered electrode is DC isolated from the RF generator by a capacitor in order that negative electron charge accumulates upon the powered electrode during half the RF cycle while positive ion charge accumulates during the next half cycle. Since electrons are more mobile than ions, a negative potential will build upon the powered electrode in order to charge the electrode negative with respect to the grounded electrode and the gaseous plasma between the electrodes. Depending upon conditions, the voltage differential may be several hundred volts.

Dry etching is achieved by placing one or more wafers upon the powered electrode. The wafer is thereby configured to receive positive ions directed from the plasma toward the negatively charged, powered electrode. The ions are accelerated substantially perpendicular to the wafer surface and embed into the surface. The ions chemically or mechanically react with the surface, and the reactive material is subsequently evacuated from the chamber. The amount of reaction is often referred to as the etch rate.

Etch rate can vary depending upon several factors including: operating pressure within the chamber, wafer temperature, electrode voltage, electrode spacing, inlet gas composition, gas flow rate, etc. Etch rate will therefore increase as the voltage across the electrodes or between the powered electrode and plasma (sheath voltage) increases. Sheath voltage will increase as the gap between electrodes decreases or if the rf voltage upon the powered electrode increases.

Slight changes in the gap or distance between electrodes may substantially change the plasma etch rate. Accordingly, it becomes important to monitor and closely control the gap as well as the electrode positions with respect to one another. It is well known that the electrode material may slightly participate in the etch reaction and therefore become thinner after a number of wafer batches have been processed. After several batches have been completed, the electrodes must be replaced and the new electrodes must be repositioned with the chamber. Furthermore, as the electrodes become thinner, they often must be repositioned so that the gap between electrodes does not become exceedingly large. If the electrodes are not periodically replaced and the gap re-calibrated, the etch rate may become considerably dissimilar from the target rate.

Not only must the gap between electrodes be maintained fairly constant throughout numerous processing batches, but also the gap must be constant across and between the planar surfaces of the electrodes. If the electrodes are not positioned substantially parallel to each other, then a wafer region within the larger gap area may be etched dissimilar from a wafer region within the smaller gap area. Maintaining parallelism and an optimal gap spacing distance is often difficult unless the operator periodically opens the chamber and performs calibration measurement on the electrodes. Frequent opening of the chamber can allow ingress of dust particles and is also time consuming.

SUMMARY OF THE INVENTION

The problems outlined above are in large part solved by the electrode position controller of the present invention. That is, the electrode position controller periodically calibrates the position of the electrodes to ensure parallelism throughout processing of numerous wafer lots. The calibration routine is performed each time the etching device has been modified, reassembled, or adjusted. Further calibration can take place each time the etching device is turned on in order to determine actual electrode position for a given set of electrodes throughout the lifetime of those electrodes. Accordingly, periodic calibration allows for the operator to readjust the electrode position to ensure parallelism and an optimal distance between electrodes without having to open the etching chamber.

The calibration technique of the present invention is stored within a programmable computer and, upon demand, is sent to the etching device with little or no user interface required. The programmable computer can also store various gap distances to ensure an optimal etch rate depending upon chosen processing parameters. For example, ultra fine-line geometries may require a different gap distance than larger geometries. The optimal gap distances can be stored within the programmable computer and retrieved with minimum user interface. Connection between the computer and the electrode mechanical drive assembly allows the computer to automatically reset the electrode gap to an optimal level, and to automatically set electrode parallelism. Still further, the user can directly manipulate the electrode up-down position via a keyboard connected to the computer. The user can merely enter the desired positional data into the computer via the keyboard. The computer then accesses an electrode drive assembly which then controllably moves the electrode. The user therefore need not open the chamber to calibrate or make small changes to the electrode position. Multiple etching devices can be attached in serial or parallel fashion to the computer interface to allow positional control from a remote location.

Broadly speaking, the present invention contemplates an electrode position controller for a semiconductor etching device. The electrode position controller comprises at least one rotatable shaft having external threads placeable through an aperture within an electrode. Rotation of the shaft causes reciprocating, up-down linear movement of the electrode. A motor is connected to one end of the shaft to provide the necessary movement, and at least one linear displacement encoder is coupled near the perimeter of the electrode to monitor movement of the electrode. The linear encoder is capable of generating a stream of digital pulses corresponding to a location and relative movement of the electrode. Drive means is provided for driving the motor a controlled distance in response to the location of the electrode.

The encoder preferably includes an index grating placed across one surface of the linear encoder, wherein the index grating is adapted to receive a light source directed upon the encoder. The index grating produces a stream of digital pulses during a time in which the light source moves across the index grating. The linear encoder also includes a reference grating placed on a select region of one surface of the encoder. The reference grating is adapted to receive a light source directed toward the select region upon the encoder. The reference grating produces a z-reference pulse when the light source strikes the select region.

The drive means includes a waveform generator adapted to produce a pulse-width modulated signal, and a pair of torque amplifiers having outputs coupled to the motor. Torque amplifiers are adapted to produce a drive current of a duration corresponding to the pulse width modulated signal.

The position controller of the present invention further contemplates a host computer having a serial communication port, and a control module coupled to the communication port for receiving an instruction signal from the computer. A waveform generator is adapted to receive a pulse-width modulated signal corresponding to the instruction signal. A pair of torque amplifiers, having outputs coupled to the motor, are adapted to produce a drive current of a duration corresponding to the pulse-width modulated signal.

The present invention still further contemplates a host computer including a data bus, and means coupled to the computer for receiving a stream of digital pulses and also for interpolating each digital pulse. A counter is coupled to the computer for counting interpolated pulses, and a register is coupled to the computer for storing a number of counts associated with the interpolated digital pulses. The number of counts can be retrieved and subsequently placed upon the data bus.

The present invention still further contemplates a method for calibrating the position of an electrode within a semiconductor etching device. The method includes the steps of providing four motors having threaded shafts placed through four corners of a moveable upper electrode and a stationary lower electrode of the etching device. The upper electrode has a range of movement between a maximum upper limit and a maximum lower limit. Four linear encoders are also provided, wherein each encoder has a base and an elongated body. The base is connected to the lower electrode, and the body extends a spaced distance beyond the outer edge of the upper electrode. The calibration technique includes moving the upper electrode toward the maximum lower limit until at least one of the four motors stalls. Thereafter, it must be determined how many of the four motors have stalled. The motors which were late in stalling or did not stall are restarted and the process is repeated until all four motors stall simultaneously. Next, the upper electrode is moved to a maximum upper limit causing each linear encoder to produce a z-reference pulse. A stream of pulses are also produced from each linear encoder representing a distance between the reference point (z-pulse) and the maximum upper limit. Once the reference point z-pulse and the stream of motor encoder pulses have been determined, the upper electrode is then moved toward the maximum lower limit to ensure all four motors stall simultaneously at the same position. Simultaneous stall of the four motors ensures that all four corners of the upper electrode are equally spaced from the lower electrode and substantially parallel to the lower electrode.

The calibration method hereof further includes the steps of moving the upper electrode to the maximum upper limit and thereafter producing a z-reference pulse and a stream of pulses from each of the linear encoders. The encoder pulses represent a distance between the reference point and the maximum upper limit at electrode regions adjacent each encoder. The relative location of each point throughout the upper electrode surface can be calculated by solving a set of simultaneous equations. Once the equations are solved, a set of corrected positional values are obtained, whereby the corrected positional values can be sent to the motors via torque amplifiers in order to realign the upper electrode substantially parallel to the lower electrode and at a known distance from the lower electrode.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1:
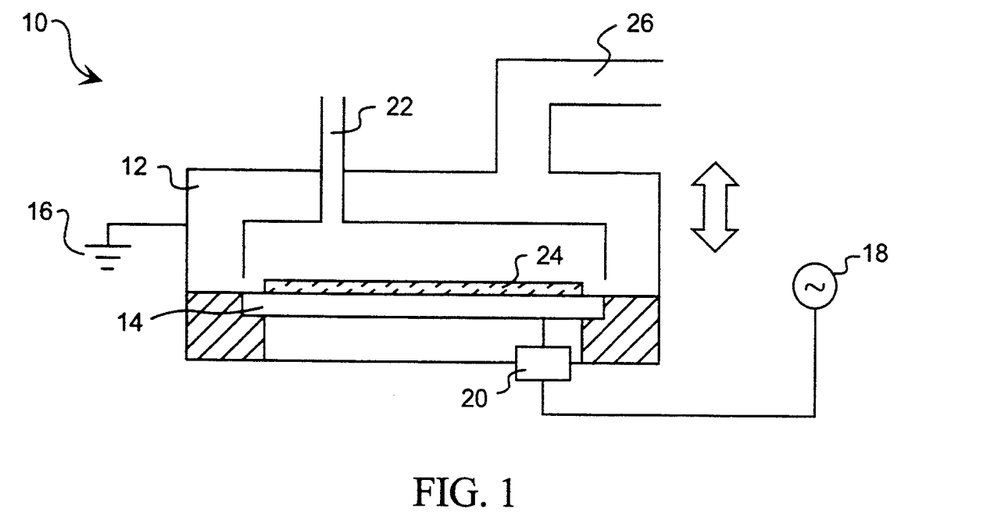
FIG. 1 is a partial side view of an etching chamber according to the present invention.

Turning now to the drawings, FIG. 1 illustrates a partial side view of an integrated circuit etching chamber 10. Chamber 10 preferably includes a moveable upper electrode 12 and a stationary lower electrode 14. Upper electrode 12 is connected to a power supply, preferably at ground potential 16. Lower electrode is preferably coupled to an RF supply 18 via capacitor 20. Supply 18 can vary in magnitude and period depending upon the etchant chosen, wafer topography to be etched, etch rate, etc. Capacitor 20 is chosen to block DC voltages upon electrode 14. A reactive gas etchant is inserted through port 22 between upper and lower electrodes 12 and 14, respectively. A suitable gas etchant includes a halogen species or various types of Freons" well known in the art. Ions can be formed within the gas plasma between electrodes, and the ions are preferably directed in an anisotropic fashion into the upper surface of wafer 24. The reactant material can then be evacuated from chamber 10 through exhaust port 26. Wafer 24 thereby receives select etching in unprotected areas across the upper surface, and the preferred etching technique shown is pure plasma, RIE, or a combination of pure plasma/RIE.

Figure 2:
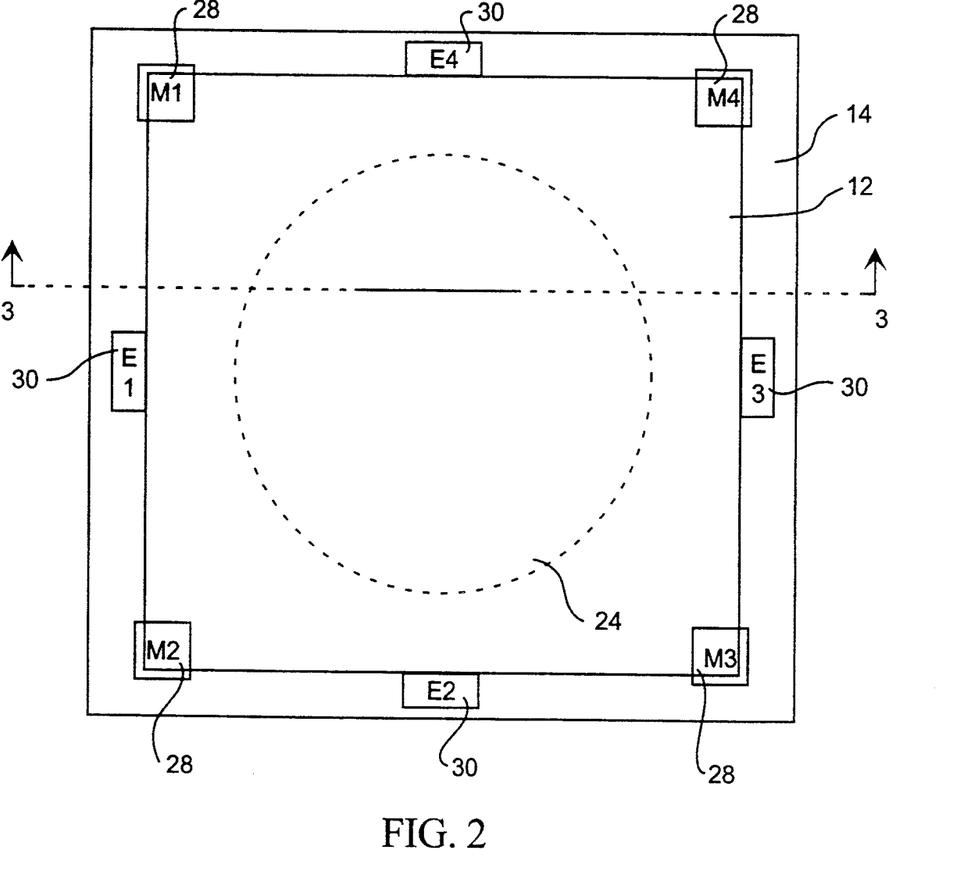
FIG. 2 is a partial top plan view of an etching device according to the present invention.

Referring to FIG. 2, the position and movement of upper electrode 12 is controlled and monitored in part by one or more motors 28 and linear encoders 30. A suitable arrangement of four motors M1, M2, M3 and M4, as well as four encoders E1, E2, E3 and E4 are shown. Each motor can be placed at the corners of upper and lower electrodes 12 and 14, respectively. Each encoder is attached to lower electrode 14 and extends in close spaced arrangement to the outer edge or perimeter of upper electrode 12. In the exemplary arrangement shown, each motor moves upper electrode 12 relative to lower electrode 14 at a respective corner of the upper electrode 12. Linear encoders 30 monitor the relative movement of upper electrode 12 at locations between pairs of motors. Four motors M1, M2, M3 and M4 placed at each corner provide suitable linear movement of the upper electrode while capable of maintaining a substantially parallel space or gap between electrode.

Figure 3:
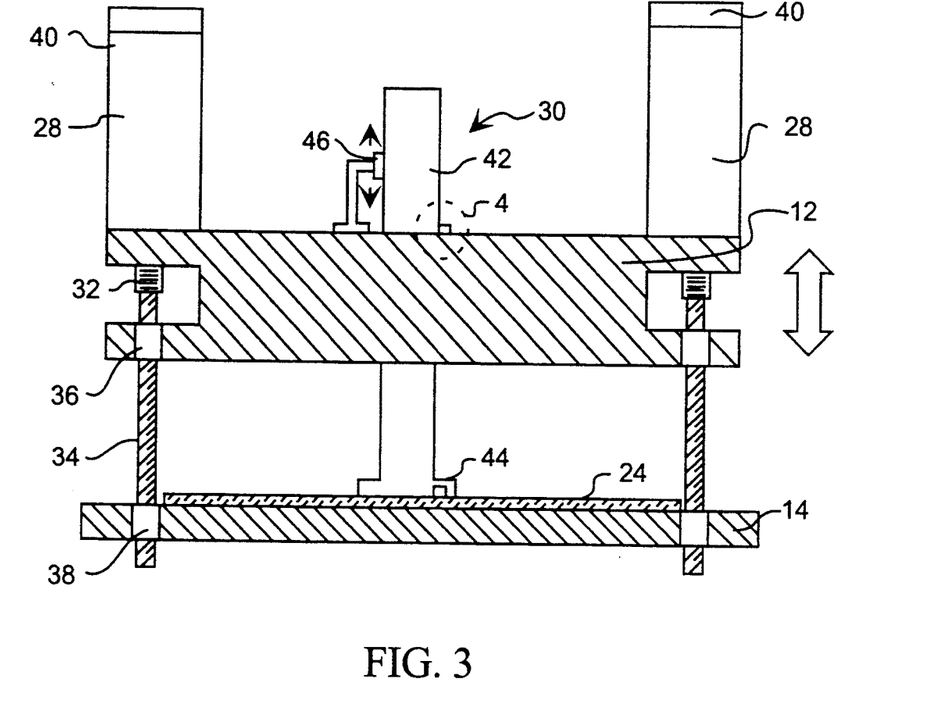
FIG. 3 is a cross-sectional view along plane 3—3 of FIG. 2.

Referring to FIG. 3, a cross-sectional view along plane 3—3 of FIG. 2 is illustrated. Specifically, the mechanism for moving upper electrode 12 and monitoring electrode 12 position is shown. Each motor 28 is coupled via coupler 32 to one end of a threaded shaft 34. The threaded shaft, preferably a 2.0 mm pitch precision ballscrew, extends through upper apertures 36 placed through upper electrode 12 and also extends through lower apertures 38 placed through lower electrode 14. A suitable ballscrew can be obtained from Nippon Seiko Corp. of Chicago, Ill., part no. W1201MA-3PY-C3Z2. A thrust bearing of common design is configured within upper aperture 36 between shaft 34 and upper electrode 12. A ballnut is configured within lower aperture 38 between shaft 34 and lower electrode 12. A suitable ballnut useable with ballscrew 34 can also be obtained from Nippon Seiko Corp. and packaged with part no. W1201MA-3PY-C3Z2. The ballnut is thereby captured in the drive frame base to allow normal (vacuum) and reverse (calibration) loads. The thrust bearing does not allow lateral movement of upper electrode 12 relative to shaft 34. Thus, shaft 34, along with upper electrode 12 and motor housing 28, move up or down whenever the motor is actuated and shaft 34 rotates. Movement occurs by normal camming design at the ballnut location. Depending upon thread design, clockwise rotation of shaft 34 will cause the distal end of shaft 34 to extend below the lower surface of lower electrode 14. Accordingly, upper electrode will move with the shaft toward the upper surface of lower electrode 14. Conversely, counterclockwise rotation of shaft 34 may cause upper electrode 12 to move away from the upper surface of lower electrode 14.

It is important when moving the upper electrode 12 that upper electrode position be closely monitored. A technique for monitoring movement of each motor is provided via a motor encoder 40 coupled to the motor and shaft 34 for measuring the number of rotations of shaft 34. Depending upon the number of rotations, the relative movement of upper electrode 12 can be estimated therefrom. Unfortunately, movement of shaft 34 does not always correspond with movement of upper electrode 12. For example, motors 28, which are preferably servo motors, can be back driven out of sync with one another, or small back drive motions can occur whenever power is lost to the motors. Back drive motions can therefore move shaft 34 while not substantially moving electrode 12. In some instances, electrode 12 may become lodged or jammed in position. Such would be the case if the electrode gap is substantially non-parallel causing lateral pinching movement of the shaft against respective apertures 36 and 38 but with relatively little linear (up and down) movement of the electrode.

In order to monitor the exact and actual position of upper electrode 12 without having to rely upon inaccurate motor encoders 40, linear encoders 30 are used. A suitable linear encoder 30 can be obtained from Heidenhain Corp., Schaumburg, Ill., part no. LS2353-2222. Each linear encoder 30 includes an elongated body 42 and base 44. Base 44 is coupled to the stationary lower electrode 14, and body 42 includes an index grating and a reference grating placed along one side of the body. The grating, of common opto-electrical design, is adapted to receive a light source attached to a moveable encoder read head 46. Read head 46 is attached to upper electrode 12 and therefore can be moved up or down with electrode 12 in close proximity to index and reference gratings.

Any movement of upper electrode 12 is registered as an amount of light traversing index gratings placed upon body 42. In response to light movement across the gratings, encoder 30 produces a corresponding stream of digital pulses. Whenever light impinges upon the reference grating, a z-reference pulse is produced indicating a reference position for upper electrode 12. Pulses within a digital pulse stream are counted when upper electrode 12 moves past a reference position indicated by an edge-triggered reference pulse. Thus, a counter is connected to the output of the pulse stream. The counter detects z-reference pulse indicating that counting is to begin or that counting is to end.

Figure 4:
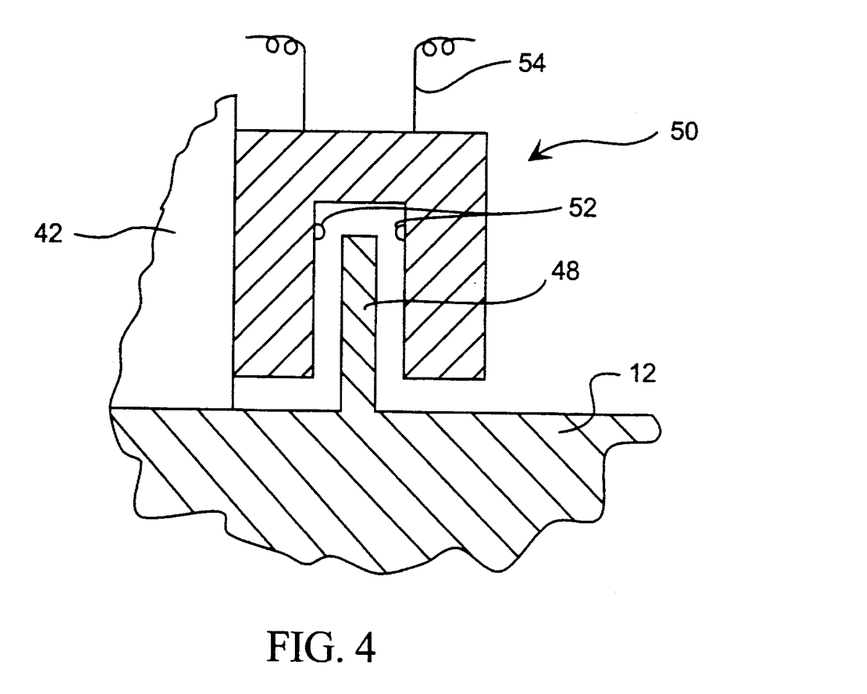
FIG. 4 is a detailed cross-sectional view along region 4 of FIG. 3.

Upper electrode 12 can move from the reference position to a maximum upper limit or a maximum lower limit. Preferably, reference position is at a midpoint between the maximum upper and lower limits. FIG. 4 illustrates a detailed section view along plane 4 of FIG. 3. The detailed view shows a mechanism for measuring the upper maximum limit. Likewise, a similar mechanism is configured near base 44 for measuring the maximum lower limit. Maximum limits are obtained whenever a protrusion or flag 48, mounted on upper electrode 12, extends a known distance into limit switch 50. Switch 50 is mounted to the side of body 42 of each linear encoder 30, and is aligned to receive flag 48. When the distal end of flag 48 blocks the light path between transmit and receive diodes 52, a signal is sent over wires 54 to motors 28. The signal will indicate that the motors and attached shaft 34 are to cease rotation. A suitable transmissive switch 50 can be obtained from Honeywell Corp. of Richardson, Texas, part no. HOA973-T55.

Limit switches 50 placed at maximum upper and lower limits upon encoder 30 signal when electrode 12 reaches maximum limits. A signal is output from the switches indicating that counting is to begin or to end. The movement of electrode 12 is monitored by starting the count when the electrode passes the reference point or when the electrode starts from a maximum position, and the count is ended when the electrode stops its movement. As such, the operator can ascertain the distance between the current electrode position and either the reference position or the maximum upper or maximum lower limit position. Further, the operator can obtain the distance between the reference position and the maximum upper limit or between the reference position and the maximum lower limit. Accurate, actual distances can be obtained at one or all upper electrode regions adjacent encoders 30.

Figure 5:
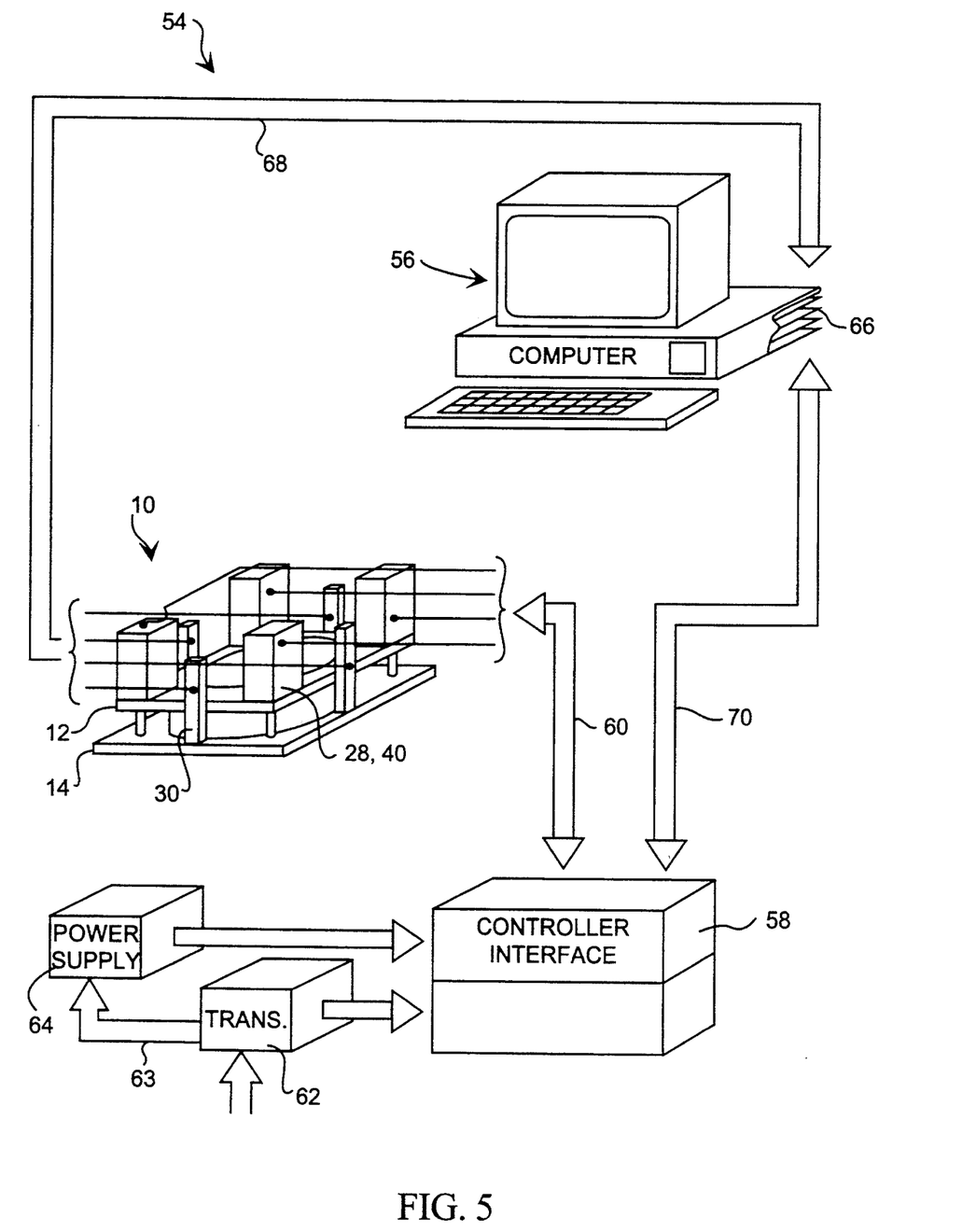
FIG. 5 is a block diagram and associated signal flow of an electrode position controller according to the present invention.

Referring now to FIG. 5, a block diagram of an electrode position controller or position controller system 54 is shown according to the present invention. Electrode position controller 54 includes the drive mechanism for an etch chamber 10, a computer 56, and a controller interface 58. Drive current to each motor 28 and signals from each motor encoder 40 are coupled to a bi-directional communication path 60 arranged between chamber 10 and interface 58. It is preferred that communication path 60 be a conductive cable shielded from external noise. A suitable cable is a standard class 5 and 7 BS630, VDE0295 which can be obtained from Parker Hannifin Corp., Rohnert Park, Calif., part no. 4011.350. Being bi-directional, path 60 allows controller interface 58 to receive digital pulse stream from motor encoders 40 and also allows controller interface 58 to send responsive drive current to each motor 28.

Controller interface 58 can be purchased as a self-contained unit from Parker Hannifin Corp., part no. 88-011270-01 D. Controller interface 58 will be described in further detail below and will be illustrated in FIG. 6. Interface 58 contains an RS232 control module as well as servo drive units capable of generating drive current sent over path 60 to motors 28. The entire interface unit 58 can also be packaged to include four motors 28 and four motor encoders 40. Interface 58 can also be packaged from Parker Hannifin Corp. to include an isolating transformer 62. Depending upon interface 58 load requirements, transformer 62 can be either a single-phase or a three-phase transformer. Transformer 62 may have its tappings jumpered for either 120 V single-phase or 240 V three-phase at the output. A suitable single-phase transformer can be obtained from Parker Hannifin Corp., part nos. T0170 or T0171. Parker Hannifin Corp. can also provide suitable three-phase transformers, part nos. T0185 and T0186.

Transformer 62 is typically used to receive an AC input, either 120 V or 240 V and to convert that output to a level useable by interface 58. Transformer 62 sends the output to power supply 64 via path 63, where it is then converted to a source of varying DC voltages. Output power supply 64 is coupled to interface 58 as shown to provide power for interface 58 and associated brushless servo motors 28 and stepping motor encoders 40. Power supply 64 operates using internal rectifiers and smoothing capacitors well known in the art. A suitable power supply can be obtained from Parker Hannifin Corp., part no. 7705.

Computer 56 includes any standard programmable device having an XT/AT data bus. A suitable computer can be obtained from any I.B.M.®-compatible vender such as, for example, CompuAdd Corp., Austin, Tex., model no. 325. Host computer 56 is retrofitted to include one or more axes interface cards 66 capable of receiving information from indexers 30 over unidirectional communication path 68. Interface card 66 can be inserted directly into a full length expansion slot within host computer 56. A suitable interface card 66 can be obtained from Heidenhain Corp., Schaumberg, Ill., part no. 1K-110. The operating manual for the Heidenhain Corp interface card describes the operation of an exemplary interface card and is herein incorporated by reference.

Encoder 30 provides three channels of information. The first and second channels each represent a series of pulses (one channel of pulses are phase shifted from the other channel). Depending upon which channel is advanced or retarded from the other, the direction in which upper electrode 12 is moving can be determined. The third channel is a z-reference pulse which occurs whenever the light source strikes the reference grating. Thus, the three channels of information are sent along path 68 to interface card 66. Interface card 66 includes three inputs to receive each of the channels of information. The first and second channels contain streams of pulses which can be interpolated such that several counts per input signal period can be obtained. For example, up to 200 counts per pulse period can be generated to achieve a higher resolution edge count capability. Subsequent to interpolation, each interpolated channel is then counted to determine the number of counts prior to the counters being stopped upon receipt of the third channel (or z-reference pulse). The number of counts can then be sent to registers either within interface card 66 or to registers within computer 56. Counted output can be sent directly to the XT/AT bus in order to allow the user to visually inspect the computer monitor screen to obtain the number of counts corresponding to electrode movement or position.

Computer 56 includes an RS-232C port common with many standard XT/AT computers. RS-232C is a standard well known in the industry and provides serial communication between data terminal equipment and data communication equipment. Interfacing a computer to a peripheral is one application. A suitable peripheral is any device which accepts serial communication such as ASCII format information over a 25-pin RS-232C connector. A peripheral connected to the RS-232C port is shown in FIG. 5 as including controller interface 58. Communication between computer 56 serial port and controller interface 58 is achieved via bi-directional communication path 70. Software necessary to present communication over path 70 can be obtained from Parker Hannifin Corp., under the tradename "System Seven X-series Commands". A summary listing of exemplary X-series software commands is available from Parker Hannifin Corp. and is herein incorporated by reference. The System Seven user manual for controller interface 58 part no. 88-011270-01 D, including a detailed listing of each X-series command, is available in its entirety from Parker Hannifin Corp.

Figure 6:
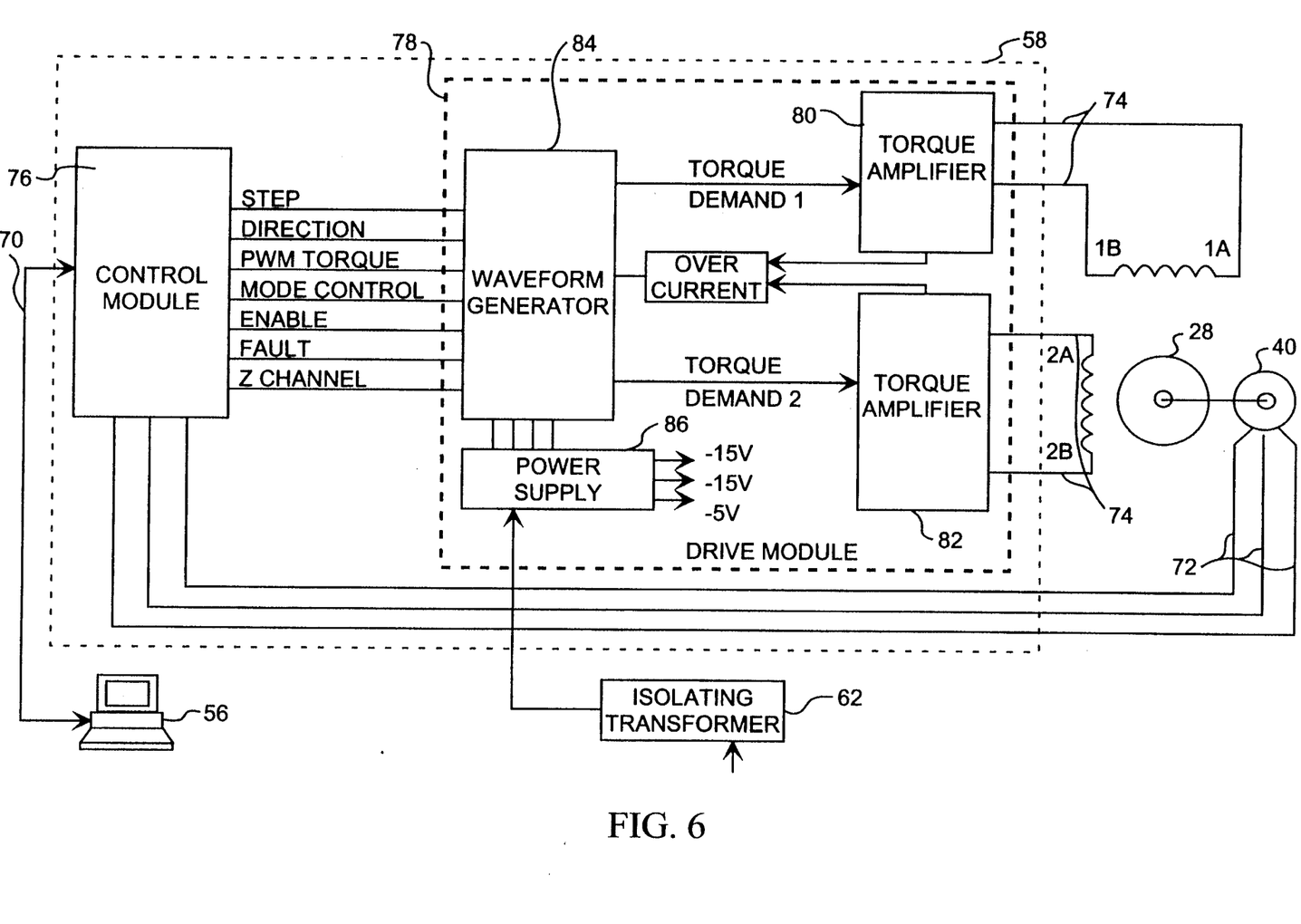
FIG. 6 is a block diagram of a controller interface connected with an etching chamber, computer and power transformer according to the present invention.

Referring now to FIG. 6, a block diagram of controller interface 58 is shown along with connections to motor 28, motor encoder 40, transformer 62 and computer 56. X-series commands are sent between computer 56 and controller interface over path 70. Path 60 (shown in FIG. 5) includes conductors 72 which receive signals from encoder 40 to control module 76, and further includes conductors 74 which receive signals from torque amplifiers 80, 82 to motor 28. Control module 76, which is part of interface 56, receives signals from motor encoder 40 as well as X-series commands from computer 56 via path 70. Output from control module 76 includes a standard seven-signal link necessary to control any type of servo motor. Thus, control module 76 functions with any type of servo motor such as a hybrid, AC brushless system, open loop stepper, and a brush DC servo. The seven signals link control module 76 to drive module 78, and provide all necessary information to activate and deactivate drive module 78 and connected motors 28. FIG. 6 illustrates, for simplicity purposes, connection to only a single motor. However, it is understood that multiple control modules and drive modules can be used and placed within controller interface 58 to drive multiple motors 28 and receive information from multiple motor encoders 40. Communication path 70 can also be daisy chained to several control modules and drive modules contained within one or more controller interface units 58.

The seven signals sent from control module 76 to drive module 78 are standard signals sent between a controller and a servo motor drive. The seven signals are fully opto-isolated at the drive end to eliminate the problems arising from electrical noise. Step and directions signals, the usual inputs to a stepper drive, are used with brushless servo drive. In this case, they are derived from encoder 40 and are used for commutation. Enable signal enables and disables motors 28. With a servo drive, this signal can disable the motor if a controller fault occurs. It can also reset a fault condition. The fault signal derives from the drive to indicate a hardware power supply or temperature problem within controller 76. PWM torque is the most significant of the seven signals. PWM (pulse-width modulated) torque signal consists of pulses at a constant frequency, the width of the pulses are related to the torque demand of drive module 78. As the torque demand changes, the mark-to-space ratio will change. A 5% mark-to-space ratio gives maximum negative torque and a 95% mark-to-space ratio gives a maximum positive torque. A zero torque is produced with a 50% mark-to-space ratio. The motor current, accurately controlled by the PWM signal, is output by the torque amplifiers 80 and 82 within drive module 78. Mode control signal is specific to hybrid and AC brushless servo drive motors using encoder feedback. It is used in power-up initialization sequences. Z-channel signal is a signal which monitors the position of motor shaft 34.

Shaft 34 is monitored by motor encoder 40 housed within the enclosure at the end of motor 28 (as shown in FIG. 3). Encoder 40 Z-channel signal and index pulse which occurs once per shaft revolution, is processed in control module 76 to track rotational position of shaft 34. The seven signal link from control module 76 is connected to drive module 78 and more specifically to waveform generator 84. Drive module 78 comprises a dual torque amplifier 80 and 82 to supply controlled current to each motor 28. Input to waveform generator 84 is from control card 76 via opto-isolators common in the art. These input signals are used within waveform generators 78 to generate the torque demand signals and send those signals to torque amplifiers 80 and 82 as shown. Torque amplifiers 80 and 82 supply current with the appropriate profile and phase to motor windings within each motor 28 under the control of the waveform generator 84. A switched mode power supply 86 operates at a frequency of approximately 80 KHz and uses output from transformer 62 to generate the internal supplies needed by drive module 78. In addition to these, two isolated supplies are generated. Five volt power supplies are available to power the control module logic and the motor encoder. Twelve volt power supplies are available for external machine control such as limit switches (i.e., limit switches 50 shown in FIG. 4).

Waveform generator 84 is part of controller interface 58 and therefore available from Parker Hannifan Corp. under self-contained package, part no. 88-011270-01 D. However, individual waveform generators can also be obtained from Parker Hannifan Corp., part no. 7252. Waveform generator 84 includes an EPROM which characterizes the drive (hybrid brushless) and contains the instructions necessary for an internal gate array to generate the appropriate current profiles. To generate the drive currents, an electrical position latch (EPL) monitors the position of the rotor using information input from the encoder 40 and uses this to generate the required current profile. PWM torque signal determines the level of current required by motor 28 to follow the input motion profile sent from encoder 40 or computer 56. These two sets of data are fed into two digital-to-analog (DAC) converters which provide the analog torque demand signals for the two torque amplifiers 80 and 82. The output current from amplifiers 80 and 82 may be limited to a maximum level by the setting of the current limit switches (see FIG. 4) mounted at the maximum upper and maximum lower limit of electrode movement range.

When controller interface 58 is switched on, motor 28 is powered up as an open loop stepping motor and the rotor will rotate to locate its nearest step. This allows drive encoder 40 to define a known electrical position. A mode input is then used to apply the necessary 90° torque angle and current is adjusted to maintain motor rotor position. If there is significant friction load on the motor, this procedure may result in operation at a non-optimal torque angle for up to one revolution of the motor shaft. The electrical position signal will then be reset by encoder pulses sent across conductors 72, and any error in torque angle will be corrected.

It is appreciated from the block diagram of FIG. 6 that control module 76 is used to control the drive necessary to controllably activate motor 28. Control module 78 receives its stimulus from one of two sources. Module 76 can receive input from motor encoders 40 which constantly monitor shaft 34 position. Otherwise, control module 76 can receive input from computer 56. Computer 56 includes an interface card which receives input from linear encoders 30 to constantly monitor the position of upper electrode 12. As such, control module can send varying torque levels at varying durations to one or more motors 28 depending upon the number of pulses sent from motor encoder 40 or index encoder 30. Each motor can be controlled transparent to the user via encoder 40 and control module 78. It is not necessary that the user always interface with controller interface 58 unless the user desires a more accurate control methodology. If the user wishes to directly interface with one or more motors 28, then he or she may do so by entering commands into computer 56 via an associated keyboard. Included herein is a "microfiche appendix" containing a source code listing of various commands, calibration and flow operations necessary to allow a user to directly interface with control module 78 via X-series commands described above.

Loading the necessary source code into computer 56 memory allows the user to access the software directly by starting the program through a command RUN-LAM when the DOS prompt appears on the screen. Execution of RUNLAM program clears the screen and informs the user that the control system 54 is about to perform a warm start calibration routine described below (see FIG. 8). It also states that the user can press certain keys to cancel the warm start calibration program. If cancellation does not occur, warm start calibration will automatically begin.

Once warm start calibration has completed, upper electrode 12 will move to maximum lower limit and then to a maximum upper limit. The screen will clear, and an exemplary main menu will appear having the following options displayed:

(1) Use cursor keys to move drive plate with coarse positioning.
(2) Use cursor keys to move drive plate with fine positioning.
(3) Move drive plate some specified distance.
(4) Change movement parameters.
(5) Show position of linear encoders.
(6) Show motor status.
(7) Perform COLD START calibration.
(8) Perform WARM START calibration.
(9) Quit.

To form an operation, the user need simply to type the number associated with that operation and hit the return or enter key. Instructions are provided by each screen throughout the system program. All the individual operations are described in detail below:

(1) "Use cursor keys to move drive plate with coarse positioning" allows the operator to coarsely move the drive plate or upper electrode 12 using the up and down keyboard cursor control arrows. The actual distance moved by each coarse cursor entry is by default 1.0 mm.

(2) "Use cursor keys to move drive plate with fine positioning" allows the operator to move the drive plate or upper electrode 12 in finer steps. The actual distance moved by each fine cursor entry is by default 0.1 mm.

(3) "Move drive plate some specified distance" allows the operator to move the drive plate or upper electrode 12 a specified distance defined by the user. When prompted, the user defines a distance in which the electrode shall be moved in either a positive "up" position or a negative "down" position. A negative distance will therefore decrease the gap distance between electrodes.

(4) "Change movement parameters" allows the user to change the distance moved for both course and fine positioning from the default amounts described above in (1) and (2) above.

(5) "Show position of linear encoder" allows the user to view the current values of encoders 30. This allows the user to quickly display the actual position of electrode 12 with respect to electrode 14.

(6) "Show motor status" allows the user to view the current values of the drive motors 28 and encoders 40. This will help the user to monitor the motors for proper operation as well as shaft 34 position. The motor encoder values do not override the linear encoder values which are purposefully dissimilar from each other.

(7) "Perform COLD START calibration" allows the user to bring the drive plates or electrodes 12 and 14 in parallel position. Cold start must be performed anytime the etch device is disassembled, physically readjusted, or after any other operation which would invalidate the last cold start calibration data. It may also be prudent or necessary to perform this operation periodically to ensure that the system meets all tolerances and specifications.

(8) "Perform WARM START calibration" allows the user to bring the drive plates or electrodes 12 and 14 in parallel position. It is recommended that warm start be performed each time the motors are enabled, or a nonparallel error may accumulate. Warm start calibration relies on previous cold start calibration to ensure proper electrode calibration. Warm start calibrates the electrodes at actual position for a fine-tune calibration operation beyond merely estimated cold start electrode calibration.

(9) "Quit" allows the user to stop etching operation and returns the user to the DOS prompt. It is important that the etching chamber not be evacuated when the user selects this operation.

Figure 7:
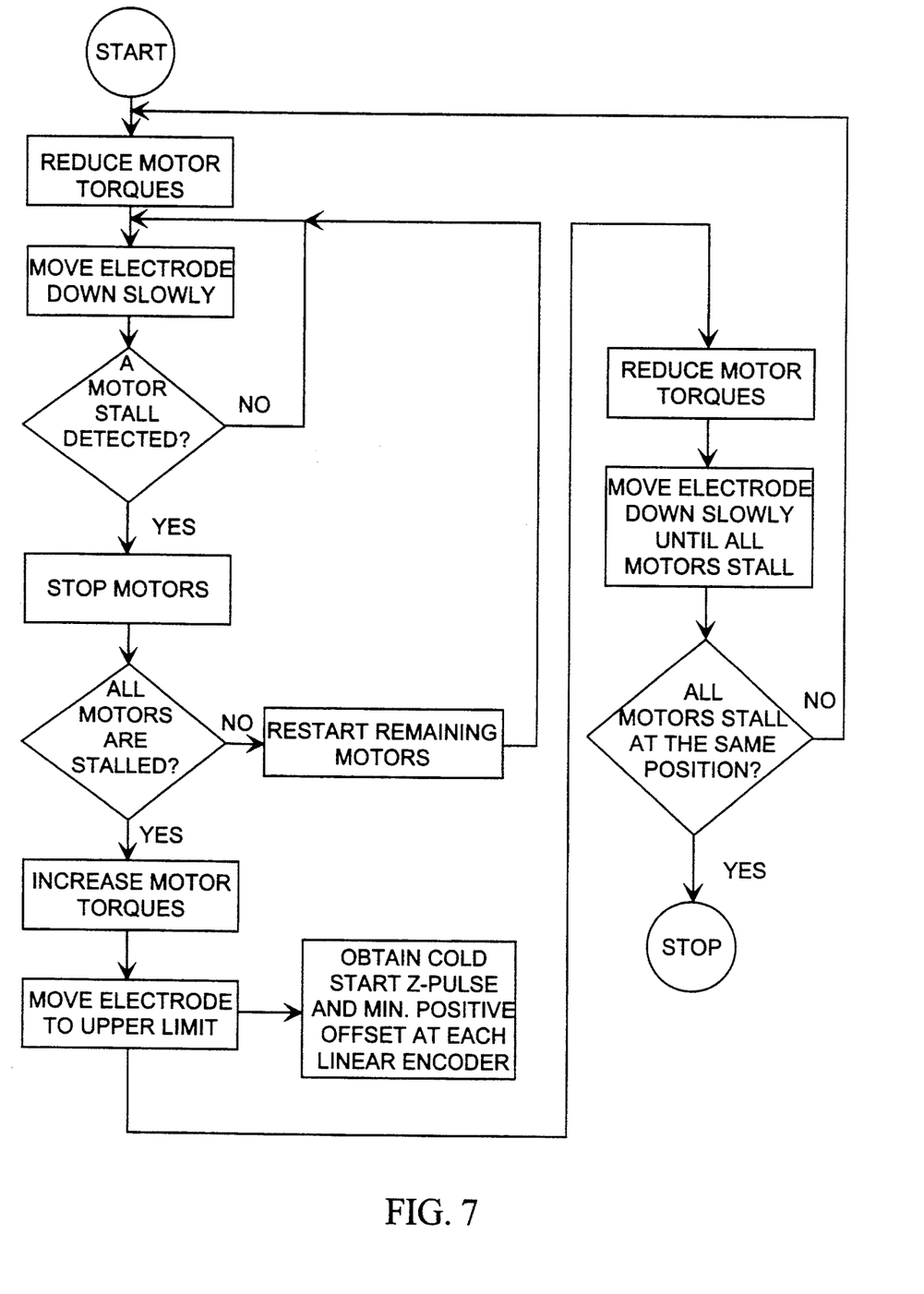
FIG. 7 is flow chart representing cold start electrode position calibration according to the present invention.

FIG. 7 illustrates a flow diagram of the cold start calibration process. When the cold start calibration option is selected from the main menu, the operating system asks the user to confirm that he or she wants to perform cold start calibration. Upon confirmation, calibration begins as shown in FIG. 7. The calibration process can be interrupted at any time by using the ESC key upon computer 56 keyboard. System software begins by reducing output from torque amplifiers 80 and 82 thereby allowing electrode 12 to move down slowly toward stationary electrode 14. Eventually, at least one motor placed at one of the corners of the upper electrode will stall. The motor which stalls is thereby associated with the electrode 12 corner which initially contacts lower electrode 14. At this point, the stalled motor corresponds with the lowest point on the upper electrode carriage. The remaining motors are then stopped and a determination is made as to whether or not all motors are stalled. If all the motors are not stalled, then the remaining motors are then restatted and driven down until another motor then stalls. The process is repeated for all the remaining motors until all motors are stalled (i.e., until the last singly driven motor is driven to a stall). At that time, all four motors are restarted under full torque, raised, reduced in maximum torque and eventually lowered with the vacuum load of etch chamber 10 to verify that all four motors stall effectively simultaneously within a tolerance band specified as a system constant. As noted above, subsequent stalls cause back drive in previous stalled motors thereby allowing shaft positions to realign with one another.

During the time in which electrode 12 is moved toward an upper maximum limit, a z-reference pulse is obtained as well as a number of pulses representing a minimum positive offset from each linear encoder 30. The z-reference pulse is one pulse sent by each linear encoder 30 representing approximately the midpoint between maximum upper limit and minimum lower limit. The minimum positive offset is obtained at each linear encoder representing the distance between the midpoint (or reference point) on which z-reference pulse is obtained and a maximum upper limit (obtained by a signal sent from switch 50). The minimum positive offset value representing a count number of pulses can be stored for subsequent use (e.g., for subsequent use in the warm calibration routine described below and shown in FIG. 8). The z-reference pulse is thereby a single reference point along the path of travel of the linear encoder. By approaching this point from a known direction and monitoring for a pulse signal transition "edge" a single reference point can be precisely known. Offsets from this point can be noted for additional reference locations. Specifically, offsets between maximum upper limit and z-reference pulse described above are designated as minimum positive offsets for each linear encoder 30 and denoted herein as $P_1$, $P_2$, $P_3$, and $P_4$. $P_1$, $P_2$, $P_3$, and $P_4$ correspond with linear encoders E1, E2, E3 and E4, respectively, as shown in FIG. 2. Differences between each motor encoder offset are common due to differences in manufacturing tolerances and mounting locations between each linear encoder and electrodes 12 and 14.

Once the z-reference pulse and minimum positive offsets of each encoder 40 are determined during cold start calibration, motor torques are reduced as indicated in FIG. 7, and then electrode 12 is moved slowly down until all motors stall simultaneously. If all motors stall at the same position (within a tolerance range), then cold start calibration is completed. If the motors stall distinctly from each other (outside a tolerance range), then cold start calibration is rerun until the system program achieves the tolerance stall condition. Preferably tolerance stall range is less than approximately 0.0001 inches. Tolerance stall condition of 0.0001 inches represents the maximum positional difference between one edge of electrode 12 and the other edge of electrode 12. One edge cannot be more than 0.0001 inches below the other edge. This value of 0.001 inches is programmed as a system constant and can be modified. It does not represent a physical limitation.

Figure 8:
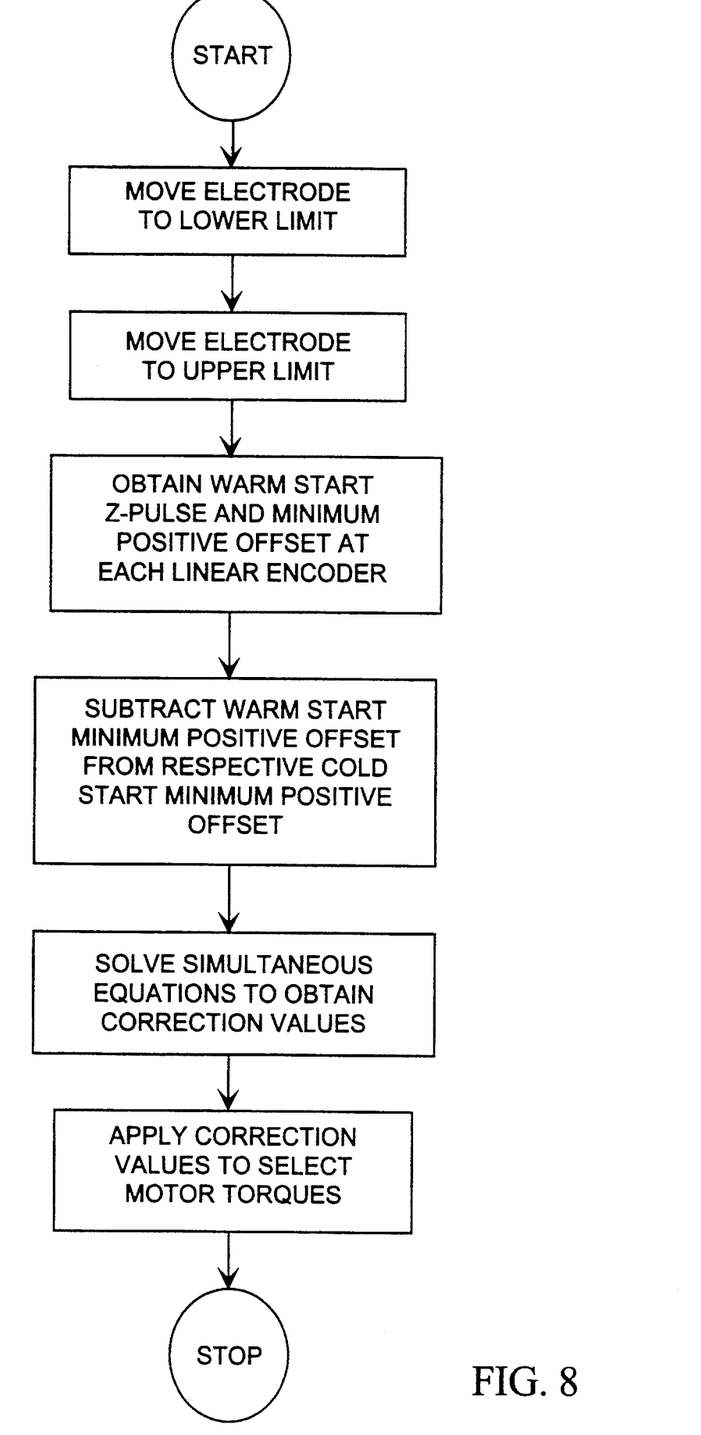
FIG. 8 is a flow chart representing warm start electrode position calibration according to the present invention.

Referring now to FIG. 8, a warm start calibration program is illustrated. As described above, each time the position controller system 54 is restarted, warm start calibration is performed. Warm start calibration ensures that the electrode plates are substantially parallel to each other, and restored to the parallel condition developed during the cold start routine. Furthermore, warm start calibration uses previous cold start calibration offsets and z-reference pulse signals at the linear encoders. As mentioned above, cold start calibration is only done in certain instances, as it develops wear and tear upon the motors and linear encoders, and is usually done only when the system is mechanically disassembled or modified. Otherwise, warm start is sufficient to restore the parallel state developed by the cold start routine, and may also be used, when modified mathematically, to update a parallel condition as adjusted for electrode wear.

Warm start begins by driving electrode 12 until a signal is received from switch 50 indicating the maximum upper position has been reached. Then, electrode 12 is driven to the minimum position signalled by the switch assembly 50 indicating that the electrode has reached the lowest possible point. Electrode 12 then travels upwards, during which time the system controller 56 monitors linear encoders 30 until z-pulses are returned from each linear encoder. As each z-pulse occurs, a count is begun. When the electrode 12 reaches the uppermost position again, a set of four counts $R_1$, $R_2$, $R_3$ and $R_4$ corresponding to each linear encoder 30 (E1 through E4, respectively) offset values from each z-pulse to the uppermost reachable position. The smallest of these four values is then subtracted from the four, yielding a set of four minimum positive values, one of which must be zero.

The minimum positive offsets ($R_1$ through $R_4$) at each linear encoder 30 obtained during warm start can then be subtracted from the minimum positive offset ($P_1$ through $P_4$) at each linear encoder 30 obtained during cold start to obtain a set of simultaneous equations necessary to obtain positional values across electrode 12 surface in relation to electrode 14 surface. An exemplary set of simultaneous equations and the calibration methodology used to obtain those equations are described below.

Warm start calibration is generally necessary whenever system 54 looses motor power while chamber 10 is under vacuum load. Warm start is also necessary if system 54 has been restarted and brought under vacuum load subsequent to a normal restart, or when any other condition exists where calibration data is valid but current electrode position is not valid. The failure to conduct warm starts when necessary may result in a build up of error which may cause a drive fault. This may happen whenever the drive motors are completely independent and may be back driven out of sync with one another. If the operator, for example, cuts motor power by exiting program software while the vacuum chamber is evacuated, small back drive motions may cause a loss of parallelism. Should the operator then restart the program software and immediately abort auto warm start calibration, the fault will not be corrected and the motors will still run. Should this series of events be repeated, the non-parallelism may grow so large that motors 28 and shafts 34 will bind during their motion. This situation is to be avoided since significant misalignment may damage shafts 34 and linear encoders 30.

Figure 9:
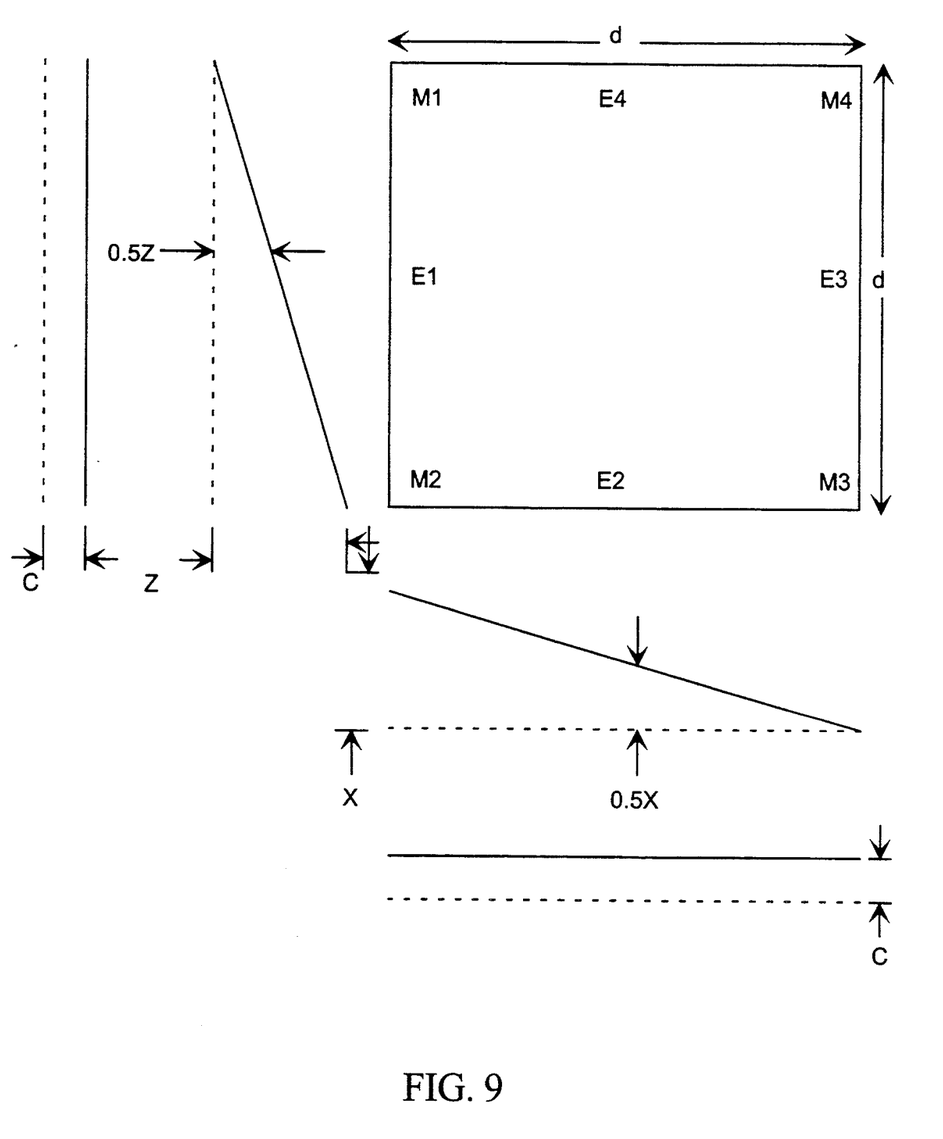
FIG. 9 is a diagram of an etching device exemplary electrode orientation and correction values necessary to fix the position of the electrode and realign the electrode.

Combined cold and warm start calibration necessary to obtain simultaneous equations and correction values are best described using a square electrode example. Shown in FIG. 9 is a diagram of electrode 12 exemplary orientation and positional values X, Z and C obtained from an exemplary four cornered electrode 12. The positional values can be used to correct any misalignment associated with electrode position and, once obtained, negative amounts applied to each positional value represent correction values necessary to realign electrode 12 parallel with electrode 14 and at a known distance from electrode 14. Motors M1 through M4 are suitably placed at each corner of the square electrode, and encoders E1 through E4 are placed at the outer edge of the electrode between adjacent corners.

Using the exemplary electrode shown in FIG. 9, M1 and M2 can be moved such that electrode 12 position at M1 and M2 is a positive X distance above the motor position at M3 and M4, the result of this motion will be to tilt the upper electrode about an axis through linear encoders E2 and E4. Another set of motor moves can apply to motors M2 and M3. Motors M2 and M3 can move in a positive Z direction extending above motor locations M1 and M4 to cause electrode 12 to tilt about an axis through linear encoders E1 and E3. Movement in a Z direction of M2 and M3 is about an axis which is thereby orthogonal to the axis of the first tilt provided by motion X.

It is well known in geometric application that the position of a substantially planar member, such as electrode 12, can be determined or fixed in two rotations and along one linear direction when one other rotation is specified. Furthermore, since electrode 14 is stationary at a known position, gap separation along the entire gap area between electrodes 12 and 14 can be easily determined once the two rotations and one linear direction are ascertained. The linear direction or movement of electrode 12 is designated as motion C. Motion C represents a certain movement of each and every point of electrode 12 either positively away from electrode 14 or negatively toward electrode 14.

As an approximation, it is proper to assume motors M1 through M4 are near or adjacent the corners of the exemplary square electrode shown in FIGS. 2 and 9, and that the linear encoders 30 are at the midpoints of each side exactly between pairs of adjacent motors. The motion at encoders 30 due to the motion X described above will be as follows:

E1: sx
E2: 0.5 sx
E3: 0
E4: 0.5 sx

The motion at linear encoders 30 due to motion Z described above will be as follows:

E1: 0.5 sz
E2: sz
E3: 0.5 sz
E4: 0

The motion at linear encoders 30 due to motion C described above will be as follows:

E1: sc
E2: sc
E3: sc
E4: sc

Scaling factor "s" is the marginal difference between linear encoder 30 readings and motor encoder 40 readings. Thus, $dE = s*dM$. Factor s depends upon the resolution selected from the interface card 66 placed within computer 56, and is also dependent upon the resolution demanded by motor encoders 40 since both sets of systems (encoder 30 and encoder 40) are reconfigurable).

The sequential positional values X, Z and C can be found by solving for each of these values in a set of simultaneous equations obtained from the difference between encoder offsets (i.e., solving for differences between $P_1$ through $P_4$ and $R_1$ through $R_4$) as described below:

$$P_1 - R_1 = sx + 0.5\ sz + sc$$

$$P_2 - R_2 = 0.5\ sx + sz + sc$$

$$P_3 - R_3 = 0.5\ sz + sc$$

$$P_4 - R_4 = 0.5\ sx + sc$$

Note that the determination of positional values and therefore the determination of correction values involves solving four equations with three variables. One can solve for any three equations and be assured the fourth should be satisfied automatically as long as the approximations of the calibration program are correct. Once X, Z and C are obtained, given a specific scaling factor S, it is a fairly simple procedure to enter those positional values via computer 56 into the main display menu. Various techniques can be used to move electrode 12 to a corrected or calibrated position given the positional values. Electrode 12 can be moved by entering the correction values into computer 56 via keyboard cursor described above, causing controller interface 58 and motors 28 to reciprocate. The correction values can therefore be applied to select motor torques necessary to move one or more shafts 34 a controlled distance in order to achieve accurate and parallel position of electrode 12. Electrode 12 can be positioned and repositioned via computer input in response to X, Z and C indicia without opening chamber 12. Furthermore, repositioning can be performed easily and quickly from a remote computer location to several possible chambers 10 connected in parallel.

It will be appreciated to those skilled in the art having the benefit of this disclosure that this invention is believed to be capable of applications with numerous types of semiconductor etching devices using a dry etch procedure. An exemplary etching device can be obtained from LA34 Research Corp. of Fremont Calif., model no. 490/590. It is to be understood that the form of the invention shown and described is taken as a preset preferred, exemplary embodiment. Various modifications and changes may be made without departing from the spirit and scope of the invention as set forth in the claims. An exemplary modification might be one which uses a dissimilar arrangement of motors and encoders placed upon either a moveable upper electrode or a moveable lower electrode. It is intended that the following claims be interpreted to embrace all such modifications and changes.

What is claimed is:

1. A method for calibrating the position of an electrode within a semiconductor etching device, comprising the steps of:

providing four motors having threaded shafts placed through four corners of a moveable upper electrode and a stationary lower electrode of a semiconductor etching device;

providing a maximum upper limit and a maximum lower limit range of movement for said upper electrode;

providing four linear encoders, each linear encoder having a base and an elongated body, wherein said base is connected to said lower electrode and said body extends a spaced distance beyond an outside edge of said upper electrode;

moving said upper electrode toward said maximum lower limit until at least one of said four motors stalls;

determining how many of the four motors have stalled;

restarting the motors which have not stalled and repeating the immediately preceding two steps until all four motors have stalled;

moving said upper electrode to said maximum upper limit;

producing a cold start z-reference pulse from each said linear encoder and a cold start stream of pulses from each said linear encoder, wherein said cold start stream of pulses represents a distance between a point in which said cold start z-reference pulse is produced and said maximum upper limit; and moving said upper electrode toward said maximum lower limit to ensure all four motors stall simultaneously at the same position and said four corners of said upper electrode are equally spaced from said lower electrode and substantially parallel to said lower electrode.

2. The method as recited in claim 1, further comprising the steps of:

moving said upper electrode to said maximum upper limit;

producing a warm start z-reference pulse from each said linear encoder and a warm start stream of pulses from each linear encoder, wherein said warm start stream of pulses represents a distance between a point in which said warm start z-reference pulse is produced and said maximum upper limit;

counting said warm start stream of pulses and counting said cold start stream of pulses at each said linear encoder;

subtracting the counted number of warm start stream of pulses from the counted number of cold start stream of pulses;

solving simultaneous equations to obtain a set of corrected positional values of said upper electrode; and applying said corrected positional values to select said motors to realign said upper electrode substantially parallel to said lower electrode and at a controlled distance from said lower electrode.

3. A semiconductor etching device comprising: an etching chamber surrounded by an inner sidewall of a stationary housing and inner surfaces of an upper electrode and a lower electrode;

at least one threaded shaft placed through a threaded upper aperture extending through said upper electrode and through a threaded lower aperture extending through said lower electrode;

a motor connected to one end of said shaft;

means connected on said upper electrode and said lower electrode between said shaft and said upper aperture and between said shaft and said lower aperture, respectively, for moving said upper electrode and shaft relative to said lower electrode;

at least one encoder attached to the lower electrode and having an index grating and a reference grating placed along one side of said encoder, said index grating is adapted to produce a stream of digital pulses corresponding to a distance in which said a light source attached to the moveable said upper electrode extends along said index grating, said reference grating is adapted to produce a Z-reference pulse when said light source strikes said reference grating;

a host computer coupled to receive and count said stream of digital pulses prior to and after receiving said Z-reference pulse;

a torque amplifier adapted to deliver activation current to said motor, whereby rotation of said motor causes said upper electrode to move in relation to said lower electrode; and means activated by said host computer for transmitting a pulse-width modulated signal to said torque amplifier, said signal is modulated according to the distance in which said light source extends across said index grating prior to said light source striking said reference grating.

4. The etching device as recited in claim 3, wherein said etching chamber is adapted to receive an etchant gas.

5. The etching device as recited in claim 3, wherein said upper and lower electrodes are adapted to receive a voltage differential therebetween.

6. The etching device as recited in claim 3, wherein said moving means comprises a camming ballnut configured between said lower aperture and said shaft.

7. The etching device as recited in claim 3, wherein said moving means comprises a thrust bearing configured between said upper aperture and said shaft.

8. The etching device as recited in claim 3, wherein said motor comprises a motor encoder adapted to produce a stream of digital pulses corresponding to a number of rotations of said motor.

9. The etching device as recited in claim 8, wherein said transmitting means comprises a control module coupled to receive said stream of digital pulses from said host computer and said stream of digital pulses from said motor encoder.

10. The etching device as recited in claim 9, further comprising means for driving said motor a controlled distance in response to the number of pulses within said stream of digital pulses.

11. The etching device as recited in claim 3, further comprising:

four threaded shafts placed through four threaded upper apertures and four threaded lower apertures, said upper and lower apertures are arranged near the four corners of a substantially square said upper and lower electrodes;

four motors, each motor is connected at one end of each threaded shaft; and four encoders, each encoder having a base and a vertically extending body, wherein said base is connected to said lower electrode inside the outer perimeter of said lower electrode and between a pair of lower apertures, and said body extends substantially perpendicular from said lower electrode and a spaced distance beyond the outside edge of the outer perimeter of said upper electrode.

12. An electrode position controller for a semiconductor etching device comprising:
at least one rotatable shaft having external threads placeable through an aperture configured within an electrode, wherein rotation of said shaft causes reciprocating movement of said electrode;
a motor connected to one end of said shaft;
at least one encoder coupled near said electrode for generating a stream of digital pulses corresponding to a location of said electrode; and
means for driving said motor a controlled distance in response to the location of said electrode.

13. The position controller as recited in claim 1, wherein said encoder comprises an index grating placed across one surface of said encoder, said index grating is adapted to receive a light source directed toward said encoder.

14. The position controller as recited in claim 13, wherein said index grating produces said stream of digital pulses as said light source moves across said index grating.

15. The position controller as recited in claim 1, wherein said encoder comprises a reference grating placed across a select region of one surface of said encoder, said reference grating is adapted to receive a light source directed toward said select region.

16. The position controller as recited in claim 15, wherein said reference grating produces a Z-reference pulse when said light source strikes said select region.

17. The position controller as recited in claim 1, wherein said driving means comprises:
a waveform generator adapted to receive a pulse-width modulated signal; and
at least one torque amplifier having outputs coupled to said motor and adapted to produce a drive current of a time duration corresponding to said pulse-width modulated signal.

18. The position controller as recited in claim 1, wherein said position controller further comprising:
a host computer including a serial communication port;
a control module coupled to said communication port to receive an instruction signal from said computer;
a waveform generator adapted to receive a pulse-width modulated signal from said control module corresponding to said instruction signal; and
a pair of torque amplifiers having outputs coupled to said motor and adapted to produce a drive current to said motor of a duration corresponding to said pulse-width modulated signal.

19. The position controller as recited in claim 1, wherein said position controller further comprising:
a host computer including a data bus;
means coupled to said computer for receiving said stream of digital pulses and for interpolating each said digital pulse;
a counter coupled to said computer for counting interpolated said digital pulses;
a register coupled to said computer for storing a number of counts associated with interpolated said digital pulses; and
addressing means coupled to said registers for retrieving said number of counts and for placing said number of counts upon said data bus.

20. The position controller as recited in claim 19, wherein said data bus is connected to a peripheral device, wherein said peripheral device comprises a keyboard and a monitor.

* * * * *

UNITED STATES PATENT AND TRADEMARK OFFICE
CERTIFICATE OF CORRECTION

PATENT NO. : 5,354,413
DATED : October 11, 1994
INVENTOR(S) : Smesny et al

It is certified that error appears in the above-indentified patent and that said Letters Patent is hereby corrected as shown below:

Claim 13, col. 19, line 15, please delete "claim 1" and substitute therefor -- claim 12--.

Claim 15, col. 19, line 25, please delete "claim 1" and substitute therefore --claim 12--.

Claim 17, col. 19, line 33, please delete "claim 1" and substitute therefor --claim 12--.

Claim 18, col. 20, line 5, please delete "claim 1" and substitute therefor --claim 12--.

Claim 19, col. 20, line 18, please delete "claim 1" and substitute therefor --claim 12--.

Signed and Sealed this

Seventeenth Day of January, 1995

Attest:

BRUCE LEHMAN

Attesting Officer     Commissioner of Patents and Trademarks